(12) United States Patent
Maruno

(10) Patent No.: US 6,276,448 B1
(45) Date of Patent: Aug. 21, 2001

(54) HEAT-TRANSFER CONNECTOR

(75) Inventor: Yasuo Maruno, Tokyo (JP)

(73) Assignee: KEL Corporation, Tokyo (JP)

( * ) Notice: Subject to any disclaimer, the term of this patent is extended or adjusted under 35 U.S.C. 154(b) by 0 days.

(21) Appl. No.: 09/667,369

(22) Filed: Sep. 22, 2000

(30) Foreign Application Priority Data

Sep. 22, 1999 (JP) .................................................. 11-268733

(51) Int. Cl.[7] ...................................................... F28F 7/00
(52) U.S. Cl. .................. 165/185; 165/80.3; 165/104.33; 174/16.3; 361/687; 361/697; 361/704; 361/709; 257/718; 257/722
(58) Field of Search .................................. 165/185, 80.3, 165/104.33; 174/16.3; 257/717, 718, 719, 722, 712, 706; 361/687, 688, 696, 697, 709, 714, 701–704

(56) References Cited

U.S. PATENT DOCUMENTS

| | | | |
|---|---|---|---|
| 3,548,927 | * 12/1970 | Spurling | 165/185 |
| 3,996,447 | * 12/1976 | Bouffard et al. | 165/185 |
| 4,041,524 | * 8/1977 | Trunk et al. | 165/80.3 |
| 4,203,488 | * 5/1980 | Johnson et al. | 165/80.3 |
| 4,215,361 | * 7/1980 | McCarhty | 165/80.3 |
| 4,707,726 | * 11/1987 | Tinder | 165/80.2 |
| 5,142,265 | * 8/1992 | Motoyoshi et al. | 338/22 R |
| 5,218,517 | * 6/1993 | Sewell | 361/388 |
| 5,760,336 | * 6/1998 | Wang | 174/52.1 |
| 5,760,676 | * 6/1998 | Yamada | 338/22 R |
| 5,832,987 | 11/1998 | Lowry et al. | 361/687 |
| 5,963,423 | * 10/1999 | Ikeda | 361/690 |
| 6,078,499 | 6/2000 | Mok | 361/687 |
| 6,097,596 | 8/2000 | Cipolla et al. | 361/687 |
| 6,118,654 | * 9/2000 | Bhatia | 361/687 |
| 6,137,683 | 10/2000 | Lee et al. | 361/704 |
| 6,144,092 | * 11/2000 | Kappes et al. | 257/718 |

* cited by examiner

Primary Examiner—Ira S. Lazarus
Assistant Examiner—Terrell McKinnon
(74) Attorney, Agent, or Firm—Robert W. J. Usher

(57) ABSTRACT

A heat-transfer connector 1 comprises a heat-collection side connector half 10, a heat-radiation side connector half 20 and comb-like contacts 25. The heat-collection side connector half 10, which is made of a metal, includes a concave receptive part 10*a* that extends in a right and left direction while the heat-radiation side connector half 20, which is also made of a metal, includes a convex insert part 20*a* that extends also in the right and left direction. The comb-like contacts 25 are provided along the front and rear walls of the insert part 20*a*, respectively, and each of the comb-like contacts 25 protrudes a little in the front and rear direction in a cross-sectional view. When these two connector halves, which are detachable, are connected with each other, heat can be conducted through the comb-like contacts 25, which are in solid contact with and between the two connector halves. In this way, the present invention provides a connector which enables efficient connection and disconnection of heat transfer without causing any leak of a refrigerant, etc.

10 Claims, 6 Drawing Sheets

HEAT-TRANSFER CONNECTOR

FIELD OF THE INVENTION

This invention relates generally to connectors used in electronic devices or industrial machinery and particularly to a heat-transfer connector which is used for connecting a heat conduction, for example, in a heat-transport device that collects and transports heat.

BACKGROUND OF THE INVENTION

Many devices used in electronics or industrial machinery include elements which generate or absorb heat locally. Usually, such devices are provided with means for radiating heat to avoid overheating of a heat-generating element or to avoid excessive cooling of a heat-absorbing element, which condition may cause, for example, a malfunctioning of or a damage to the heat-generating element or heat-absorbing element (such an element is hereinafter referred to as "heat-generating element" collectively) itself or other components located nearby.

For example, a personal computer includes many heat-generating elements such as a CPU (MPU), memory modules, and a hard disk drive. To ensure stable operation, heat generated by these elements is transferred to the housing or the keyboard by conduction and radiated into the air naturally (hereinafter referred to as "natural air-cooling") or cooled by a small fan (hereinafter referred to as "forced air-cooling").

In recent years, microprocessors have gone through a number of drastic performance improvements and modularization. Because of this advancement, the rate of heat generated when they operate has increased accordingly. Notebook type personal computers which include such microprocessors in highly miniaturized thin bodies are now pushed to a limit in the design of heat conduction and radiation because they are designed to utilize natural air-cooling or forced-air cooling for dispersing the heat generated by the microprocessors, etc.

In this situation, heat transportation type cooling devices are now coming into practical use. A cooling device of this type includes heat-collecting means which comprises a metal plate, and the heat-collecting means is adhered to a heat-generating element. The heat from the heat-generating element is absorbed by this heat-collecting means and is transferred through heat-transferring means such as a heat pipe to the external part of the main body of the computer, where the heat is radiated by heat-radiating means, which may comprise a heat-radiating fin or a cooling fan provided externally on the computer. It is known that such heat-transferring means provides a high efficiency for the cooling of the heat-generating element. In addition, because the heat-radiating fin and the cooling fan are arranged externally over the computer, the internal space of the computer can be designed more effectively for further miniaturization, or the degree of freedom in component arrangement is improved.

By the way, there is a notebook book type personal computer (hereinafter referred to as "note PC") in which a floppy disk drive (hereinafter referred to as "FD drive") and a CD-ROM drive (hereinafter referred to as "CD drive") are provided not in the main body of the note PC but are in a separate station for improved portability and for battery power conservation. In this case, because the main body of the note PC is separable from the station and independently portable, the note PC can be further reduced in thickness and weight for a portability improvement. To enable the operation of the note PC in this separated condition, a built-in battery is provided in the main body, and generally the operational speed of the built-in microprocessor is reduced to conserve energy and increase the life of the battery.

When this thin note PC is mounted on the station, the note PC receives power through a power adapter from a home-use power supply. In this condition, the microprocessor can access to all the drives in the station and operates at a full speed without any influence from the condition of the battery.

When this separable thin note PC is used separately from the station as a portable unit, the microprocessor is controlled to operate at a speed which is restricted for power conservation. Therefore, the microprocessor produces heat at a rate lower than when it is operated at a full speed on the station. Although the rate of the heat produced by the microprocessor is lower when the note PC is used separately than when it is used with the station, the cooling device of the note PC must be designed to have a capacity sufficient for cooling the microprocessor that is operated at a full speed. This design condition requires a comparatively large cooling device and makes it difficult for the main body of the note PC to be miniaturized further.

SUMMARY OF THE INVENTION

It is an object of the present invention to provide a heat-transfer connector which is used, for example, in a heat-transport device to transfer heat from a heat-generating element.

It is another object of the present invention to provide a detachable heat-transfer connector which is applicable by a solid contact and transfers a large amount of heat at a high efficiency.

In order to achieve these objectives, the present invention provides a heat-transfer connector which comprises a first connector half (for example, the heat-collection side connector half 10 of an embodiment described in the following section) and a second connector half (for example, the heat-radiation side connector half 20 of the following embodiment). The first connector half comprises a first connector body made of a metal, and the first connector body includes a receptive part that has a concave cross-section and extends in a right and left direction. The second connector half comprises a second connector body and a comb-like contact. The second connector body is made of a metal and includes an insert part that has a convex cross-section and extends in the right and left direction. The comb-like contact, which is made of a metal and capable of deforming elastically, is provided along at least one of the front and rear sides of the insert part, protruding outward at least from the front or rear side of the insert part in a cross-sectional view. By inserting the insert part into the receptive part, the first and second connector halves are detachably connected with each other for heat transfer through a solid contact achieved by the comb-like contact which is sandwiched between the first and second connector halves.

In this heat-transfer connector, the first and second connector bodies and the comb-like contact are made of a metal having a high thermal conductivity, and the comb-like contact is formed to have thin tooth-like contact portions. Therefore, when the two connector halves are engaged with each other, the contact portions of the comb-like contact are deformed elastically to meet and fit in with the internal surfaces of the receptive part, and thereby the comb-like contact ensures an appropriate amount of contact area for heat transfer in the connection. As a result, an efficient heat conduction is achieved by a solid contact of the connector halves, which are made of a metal with a high thermal conductivity. This condition keeps the heat conduction resistance between the connector halves at a relatively low level.

It is preferable that the receptive part of the first connector half be formed in a rectangular box and that the insert part of the second connector half be provided with lateral end protection members (for example, the guides 21*l* and 21*r*) at the right and left ends thereof In this case, the lateral end protection members are to protect the right and left ends of the comb-like contact when the insert part is inserted into the receptive part. With this design, even if the right and left ends of the insert and receptive parts are accidentally hit with each other when the first and second connector halves are to be engaged, there will be no damage to the comb-like contact, which is provided on the second connector half. Therefore, by the provision of the lateral end protection members, the tolerance for mis-alignment and the ease of handling are improved for the engagement of the connector halves.

It is also preferable that the insert part of the second connector half be provided with an upper end protection member (for example, the contact cover 28) at an insertion edge thereof. In this case, the upper end protection member protects the tooth tips of the comb-like contact. By providing this protection member, the comb-like contact is protected from any accident which may happen to deform or damage the comb-like contact, for example, the insert part may be twisted during the insertion, the top of the insert part may be accidentally hit to a part of peripheral equipment, or the comb-like contact may be wiped for cleaning without care. Therefore, by the provision of the upper end protection member, also, the tolerance for mis-alignment and the ease of handling are improved for the engagement of the connector halves.

It is further preferable that the insert part of the second connector half be provided with a fixing part (for example, the ribs 21*c*) at a base end thereof. In this case, the fixing part is used for surface-mounting and fixing the root portion of the comb-like contact. With this construction, the comb-like contact is fixed on the second connector half with a relatively large contact area, and thereby the heat conduction route of the second connector half is made relatively short. As a result, the heat being conducted from the first connector half through the comb-like contact is transferred to the second connector half at a high efficiency. Thus, the present invention provides a heat-transfer connector which has a high efficiency for heat transfer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only and thus are not limitative of the present invention.

DESCRIPTION OF THE PREFERRED EMBODIMENTS

Figure 5:
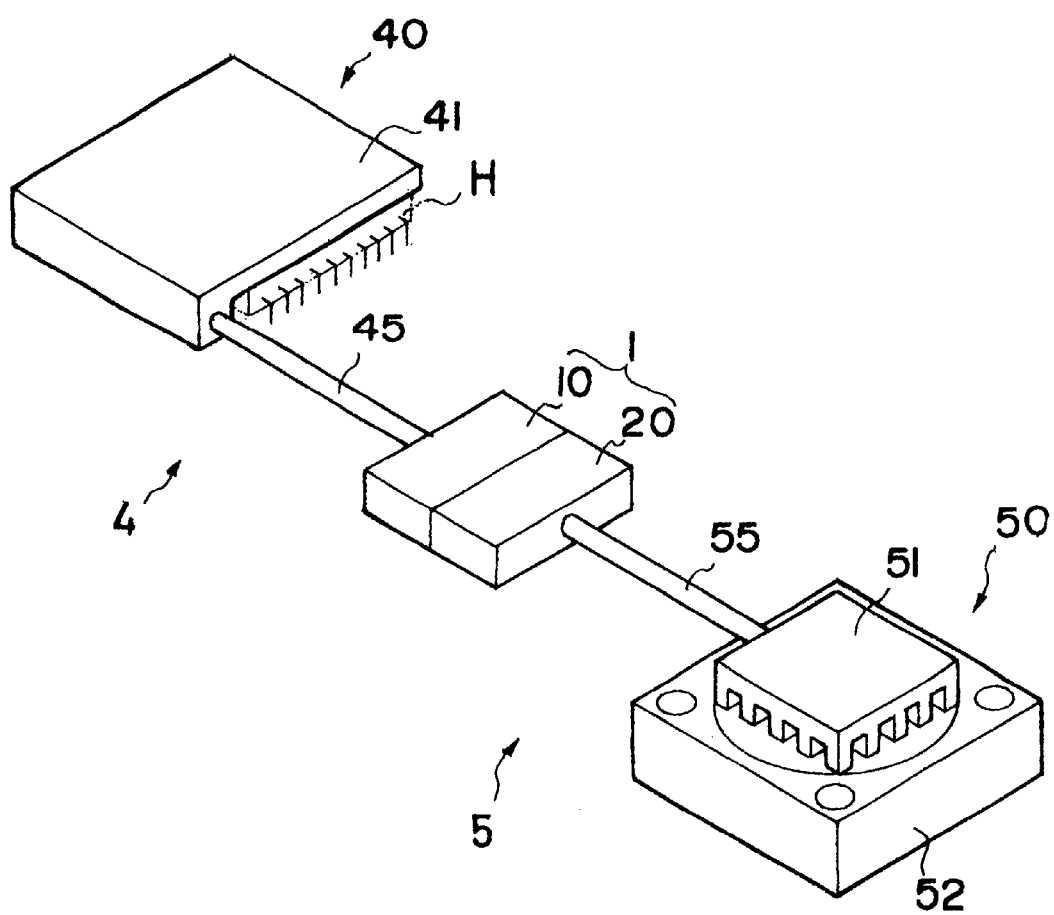
FIG. 5 is a perspective view of a heat-transport device which comprises the heat-transfer connector according to the present invention.

FIG. 5 shows a heat-transport device which incorporates a heat-transfer connector 1 according to the present invention. At first, this heat-transport device is explained.

The heat-transport device comprises heat-collecting means 40, heat-transferring means 45 and 55, heat-radiating means 50 and the heat-transfer connector 1. The heat-collecting means 40 collects heat from a heat-generating element H, and the heat being collected by the heat-collecting means 40 is transferred through the heat-transferring means 45 and 55 and radiated at the heat-radiating means 50. The heat-transfer connector 1 offers a solid contact for heat transfer between the heat-transferring means 45 and 55, and it connects and disconnects the heat-collecting means 40 and the heat-radiating means 50.

The heat-collecting means 40 comprises a heat-collecting body 41 made of a metal having a high thermal conductivity in a thin plate or block figure. When the heat-collecting means 40 is attached to the heat-generating element H, it removes heat effectively from the heat-generating element H. At an end on one side of the heat-collecting body 41, one end of a heat-collection side heat pipe 45, which is the heat-transferring means, is connected mechanically and thermally. Therefore, the heat collected from the heat-generating element by the heat-collecting body 41 at the one end of the heat-collection side heat pipe 45 is transferred effectively to the heat-transfer connector 1, which is connected at the other end.

The heat-radiating means 50 comprises a heat-radiating fin 51 and a fan 52, and the heat-radiating fin 51 is connected to the heat-transfer connector 1 through a heat-radiation side heat pipe 55. Therefore, the heat being transferred from the heat-transfer connector 1 through the heat-radiation side heat pipe 55 is radiated into the air at the heat-radiating fin 51, actively by rotating the fan 52.

The heat-transfer connector 1 comprises a matable pair of a heat-collection side connector half 10, which is connected to the heat-collection side heat pipe 45, and a heat-radiation side connector half 20, which is connected to the heat-radiation side heat pipe 55. When these connector halves are engaged in a solid contact by means of comb-like contacts and thermally connected to each other (the construction of the connector halves will be explained in detail later), the heat collected by the heat-collecting means 40 from the heat-generating element H is transferred to the heat-radiating means 50.

Because the heat-transport device is separable at the heat-transfer connector 1 into two units, namely, a heat-collecting module 4 (which comprises the heat-collecting means 40, the heat-collection side heat pipe 45 and the heat-collection side connector half 10) and a heat-radiating module 5 (which comprises the heat-radiating means 50, the heat-radiation side heat pipe 55 and the heat-radiation side connector half 20). Each separable unit can be produced individually and incorporated in a different part of the device. Now, a description is given of the construction of the heat-transfer connector 1, which constitutes the key part of this separable heat-transport device.

Figure 1:
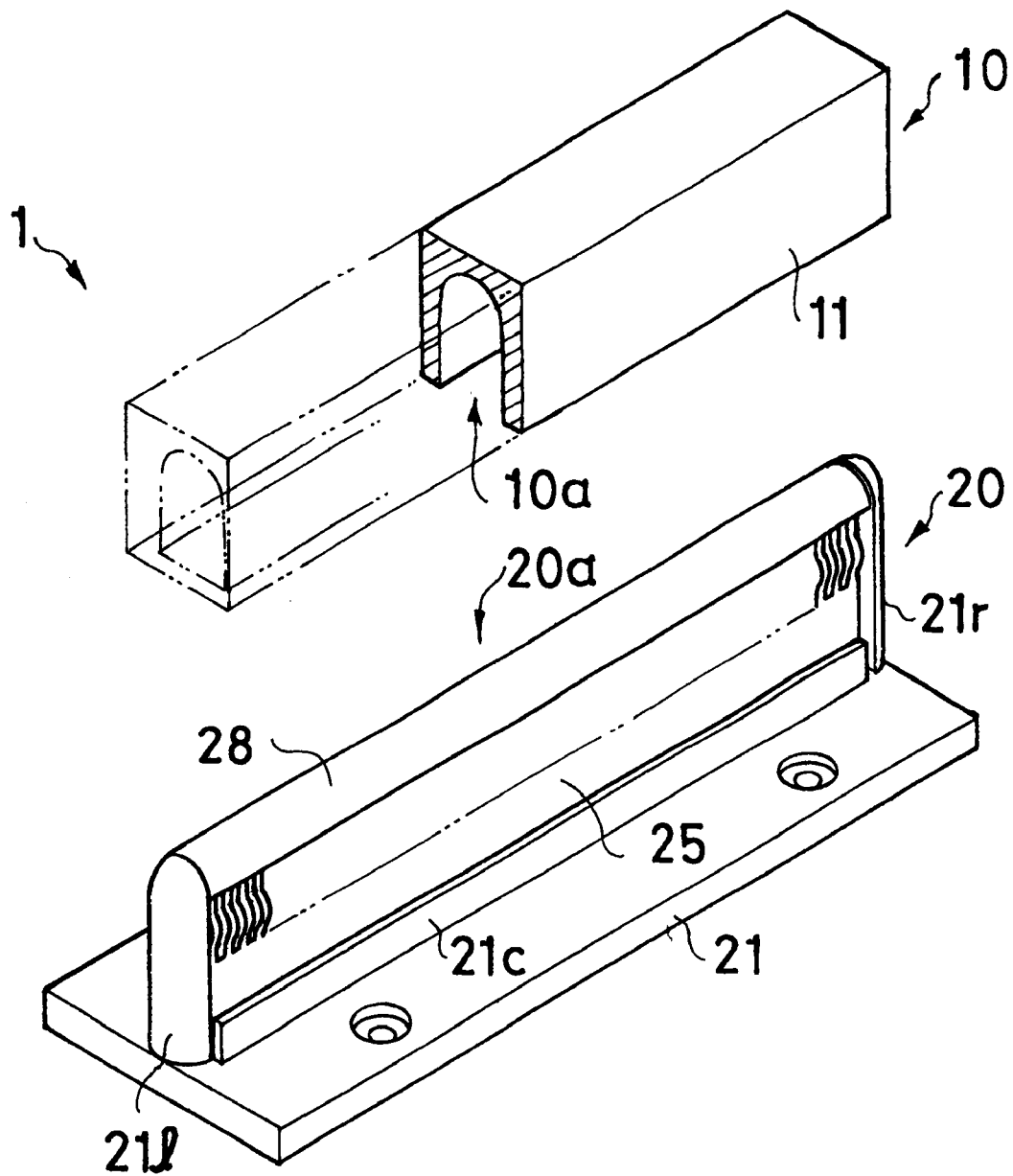
FIG. 1 is a perspective view of a preferred embodiment of heat-transfer connector according to the present invention.

FIG. 1 shows a preferred embodiment of heat-transfer connector 1 according to the present invention. This heat-transfer connector 1 comprises a heat-collection side connector half 10 and a heat-radiation side connector half 20. The heat-collection side connector half 10 comprises a heat-collection side connector body 11 which extends from side to side and has a receptive part 10a whose cross-section is concave. The heat-collection side connector body 11 is formed of a metal having a high thermal conductivity such as an aluminum alloy or a copper alloy, for example, by a method of die-casting or shell-molding. If necessary, it is machined, for example, milled, ground and bored, so that the groove of the heat-collection side connector body 11 will achieve a predetermined dimension. Furthermore, the surface of the heat-collection side connector body 11 may be treated, for example, by a method of plating or a vapor deposition. In the following description, for ease of description, the vertical direction of the figures shown in FIG. 1 is referred to as "up and down direction" while the direction of the length of the concave groove is referred to as "right and left direction", and the direction perpendicular to these two directions is referred to as "front and rear direction".

Figure 2A:
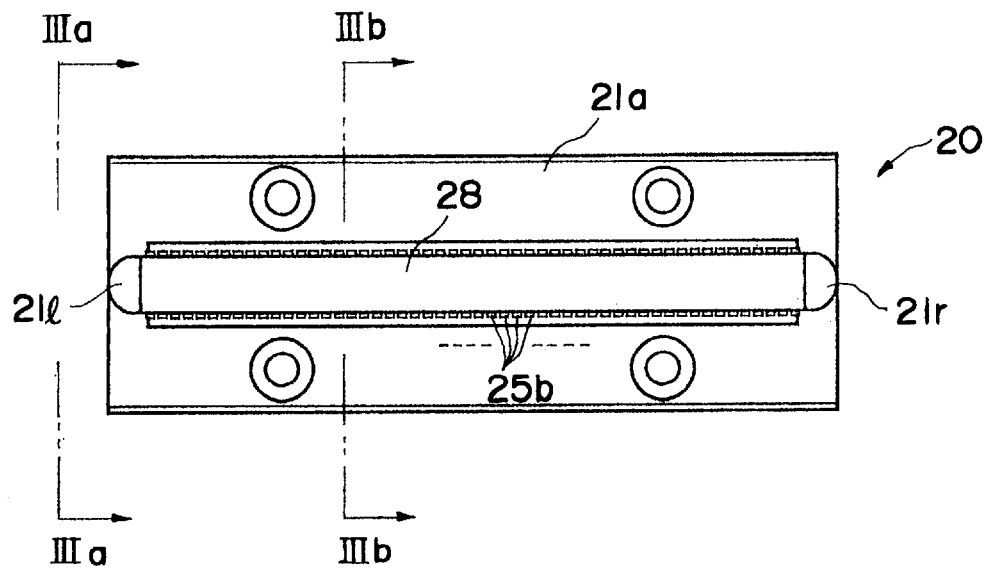
FIGS. 2A and 2B are a plan view and a front view of a heat-radiation side connector half of the heat-transfer connector.
Figure 2B:
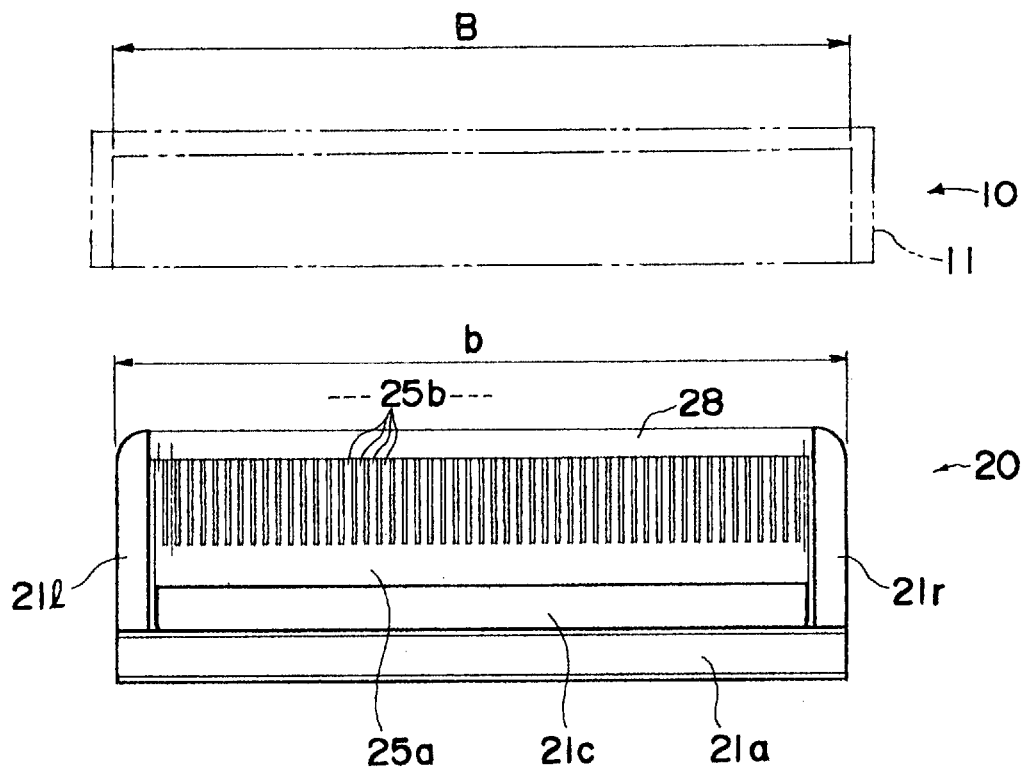
Figure 3A:
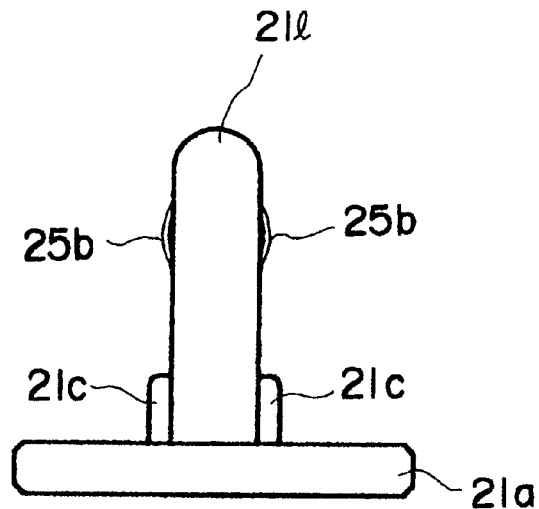
FIGS. 3A and 3B are a side view and a representative sectional view shown in the same direction, of the heat-radiation side connector half.
Figure 3B:
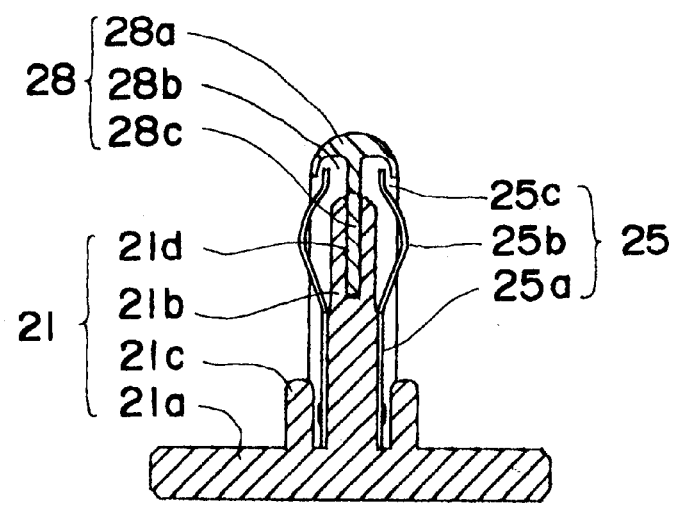

The heat-radiation side connector half 20 comprises a heat-radiation side connector body 21 which extends in the right and left direction and has a convex insert part 20a, which engages with the receptive part 10a of the heat-collection side connector half 10. The heat-radiation side connector half 20 further comprises comb-like contacts 25 whose teeth extend along and protrude a little from the front and rear surfaces of the insert part 20a, and a contact cover 28 is provided at the top of the insert part 20a to protect the tooth tips of the comb-like contacts 25. FIGS. 2A and 2B are a plan view and a front view of the heat-radiation side connector half 20, and FIGS. 3A and 3B are a left side view and a representative sectional view of the heat-radiation side connector half. These figures are referred in the following description.

As shown in FIG. 3B, the heat-radiation side connector body 21 comprises a base plate 21a, an upward protrusion 21b, ribs 21c, a groove 21d and guides 21l and 21r. The ribs 21c are provided parallel with and in front and rear of the protrusion 21b, and the guides 21l and 21r are semi-circular columns, each provided at the right or left end of the protrusion 21b, respectively. The groove 21d is provided at the top of the protrusion 21b to receive and fix the contact cover 28. The heat-radiation side connector body 21 is formed of the same metal and in the same way as the heat-collection side connector body 11.

The comb-like contacts 25 are provided over the front and rear of the protrusion 21b of the heat-radiation side connector body 21. Each comb-like contact 25 comprises a continuous plate-like root portion 25a, contact portions 25b and tooth tips 25c. The contact portions 25b are cut into teeth like a comb, and all the teeth are bent in a wave form, such that they protrude a little from the protrusion 21b of the heat-radiation side connector body 21. The comb-like contacts 25 are fixed by press-fitting or calking the root portions 25a between the protrusion 21b and the ribs 21c of the heat-radiation side connector body 21, respectively. In this fixed condition, each of the root portions 25a is in surface contact with the front or rear of the protrusion 21b, respectively. Each comb-like contact 25 is formed of a spring metal having a high thermal conductivity such as a phosphor bronze and a beryllium copper (a spring steel may be also used depending on the use environment), for example, by precision press molding. If necessary, the surfaces of the comb-like contacts 25 are treated with a corrosion-resistant metal.

The umbrella-like contact cover 28 is press-fit or glued into and fixed in the groove 21d, which is located at the upper end of the protrusion 21b of the heat-radiation side connector body 21, to protect the tooth tips 25c of the comb-like contacts 25, which extend upward from the base plate 21a of the heat-radiation side connector body 21, from being deformed or damaged by an object which may hit them accidentally. The contact cover 28 protects the tooth tips 25c in the upper direction and in the front and rear directions as shown in FIG. 3B. In this condition, the contact portions 25b of the comb-like contacts 25 are deformable elastically in the front and rear directions in the rooms 28b defined below the contact cover 28.

The guides 21l and 21r, each of which is a semi-circular column having a semi-spherical top of radius R, are provided at the right and left ends of the protrusion 21b of the heat-radiation side connector body 21. The outermost width b (in the right and left direction) and thickness t (in the front and rear direction) of the guides 21l and 21r and the opening width B and thickness T of the receptive part 10a of the heat-collection side connector half 10, which receives the heat-radiation side connector half 20, are designed such that the opening width B and thickness T of the receptive part 10a are slightly larger than those of the guides 21l and 21r. With this construction, the right and left sides of the comb-like contacts 25 are protected by the guides 21l and 21r, so there is no possibility of the comblike contacts 25 being deformed or damaged by any external force acting laterally. While the protrusion 21b of the heat-radiation side connector body 21 is being inserted into the receptive part 10a, these guides 21l and 21r function to lead the insertion. Therefore, the engagement and detachment of the heat-collection side connector half 10 and the heat-radiation side connector half 20 are carried out smoothly. Furthermore, while the connector halves are in engagement, these guides prevent any linear or rotative movement of the heat-collection side connector body 11 relative to the heat-radiation side connector body 21 in the front and rear direction or in the right and left direction. As a result, no external force can act directly to push or twist the comb-like contacts 25, so they are protected securely against deformation.

Figure 4:
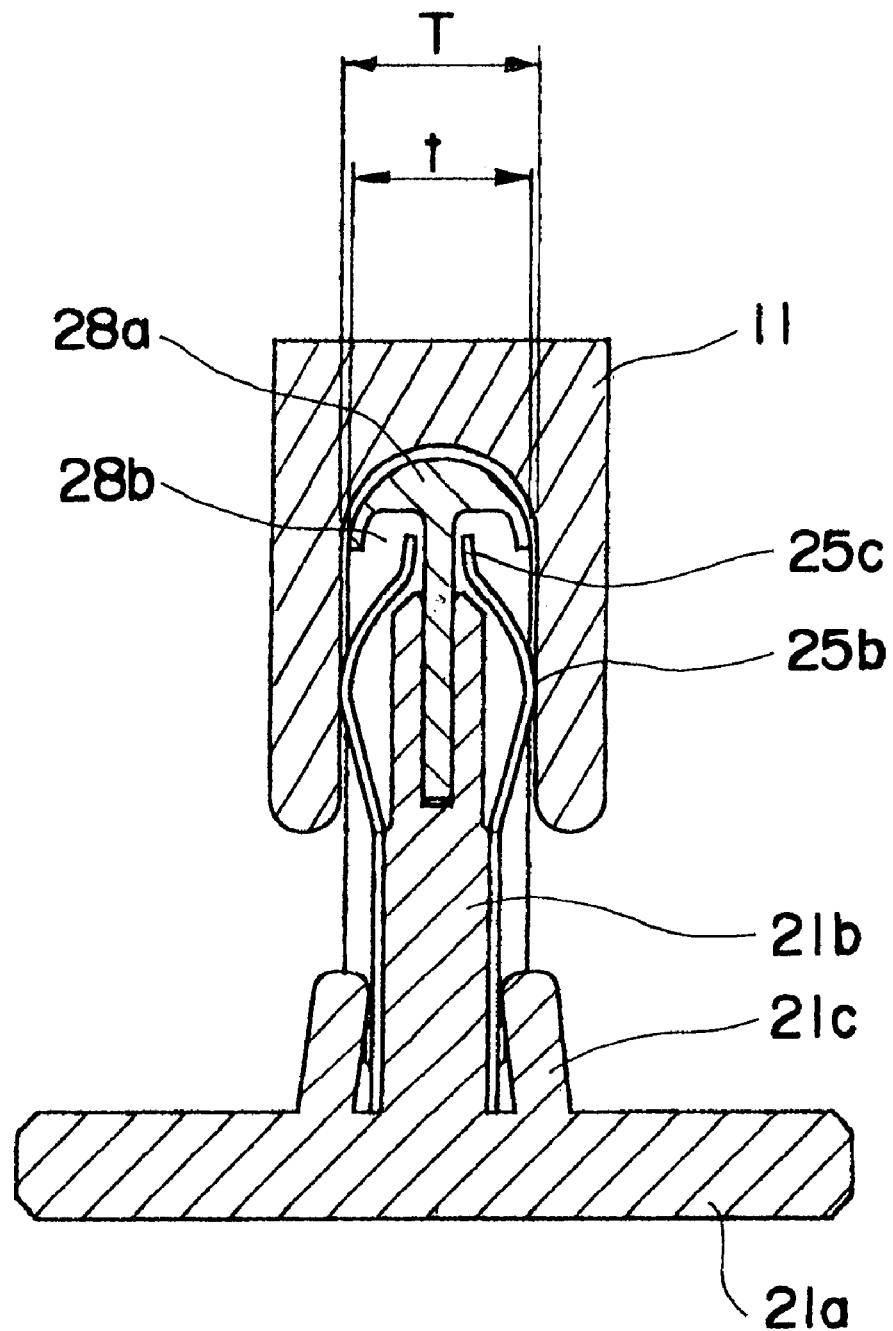
FIG. 4 is a sectional view showing the engaged condition of the connector halves of the heat-transfer connector.

The heat-collection side connector half 10 and the heat-radiation side connector half 20 constructed as described above are engaged with each other by inserting the insert part 20a of the heat-radiation side connector half 20 into the receptive part 10a of the heat-collection side connector half 10. As shown in FIG. 4, which is a sectional view of these connector halves in engagement, the heat-collection side connector half 10 and the heat-radiation side connector half 20 are positioned to each other, and then the guides 21l and 21r are inserted into the receptive part 10a in the upward direction for the engagement of the connector halves. During the insertion, when the heat-collection side connector half 10 is moved downward relative to the heat-radiation side connector half 20, the rounded part at the entrance of the receptive part 10*a* comes into contact with the contact portions 25*b* of the comb-like contacts 25, which protrude a little forward and rearward. After this contact, when the heat-collection side connector half 10 is moved further downward for the engagement with the heat-radiation side connector half 20, the entrance of the receptive part 10*a* slides over the contact portions 25*b* and presses the comb-like contacts 25 inward. At this time, the comb-like contacts 25 are deformed elastically by the pushing force of the contact with the receptive part 10*a*, so the tooth tips 25*c* of the comb-like contacts 25 are moved inward under the contact cover 28. In the fully engaged or connected condition, the contact portions 25*b* of the comb-like contacts 25 are positioned in the receptive part 10*a* and are in contact with the internal walls of the receptive part 10*a* as shown in the figure.

In the connected condition, because the contact portions 25*b* of the comb-like contacts 25 are in a form of comb (having rectangular slices), the contact portions 25*b* are deformed elastically to meet and fit in with the internal surfaces of the receptive part 10*a*, where they are inserted. As a result, an appropriate amount of contact area for heat transfer is ensured between the comb-like contacts 25 and the heat-collection side connector body 11. On the other hand, the root portions 25*a* (plate portions) of the comb-like contacts 25 are in contact with the heat-radiation side connector body 21 with a relatively large contact area for heat transfer. The pressure for the surface contact of the contact portions 25*b* of the comb-like contacts 25 is maintained by the force generated from the elastic deformation while the plate-like root portion 25*a* is pushed onto the upper part of the protrusion 21*b* by the reaction force generated from the comb-like contacts 25 acting in leverage.

This construction ensures that the two connector halves acquire the contact pressure and contact area necessary for efficient heat transfer and that the distance heat travels between these connector halves is minimized. Therefore, the heat-transfer connector transfers heat efficiently with a relatively low heat conduction resistance between the heat-collection side connector half 10 and the heat-radiation side connector half 20.

Although the heat-collection side heat pipe 45 and the heat-radiation side heat pipe 55, which function as heat-transferring means, are not shown in any of FIGS. 1, 2, 3 and 4, these heat pipes can be provided appropriately in consideration of the position and orientation of the heat-transfer connector 1. For example, the base plate 21*a* of the heat-radiation side connector half 20 is provided with a bore hole in an appropriate direction (front, rear, right, left or bottom), and this bore hole is used for the mounting of the respective heat pipe. Also, a groove may be provided for the same purpose, and the heat pipe is calked or glued with a heat conductive adhesive. In this way, the heat pipes are connected relatively easily and mechanically and thermally to the connector halves, respectively.

In the above embodiment, the connector half having a concave receptive part 10*a* is designated as the heat-collection side connector half 10 while that having a convex insert part 20*a* is designated as the heat-radiation side connector half 20 for ease of description. However, it is clear from the above description that they can be arranged in a reversed fashion without causing any problem. Depending on the condition where the heat-transfer connector is applied, one of the connector half may be designated as the heat-collection side connector half and the other as the heat-radiation side connector half, and an intended objective is still achievable.

In a heat-transport device which includes the heat-transfer connector 1 constructed as described above, the heat-collection module 4 and the heat-radiation module 5 can be connected to and disconnected from each other freely without causing any leak of a refrigerant, etc. When both are connected, the heat from the heat-generating element H of the heat-collection module 4 is transferred efficiently through the heat-transfer connector 1 to the heat-radiating means 50 of the heat-radiation module 5 for a cooling purpose.

Figure 6:
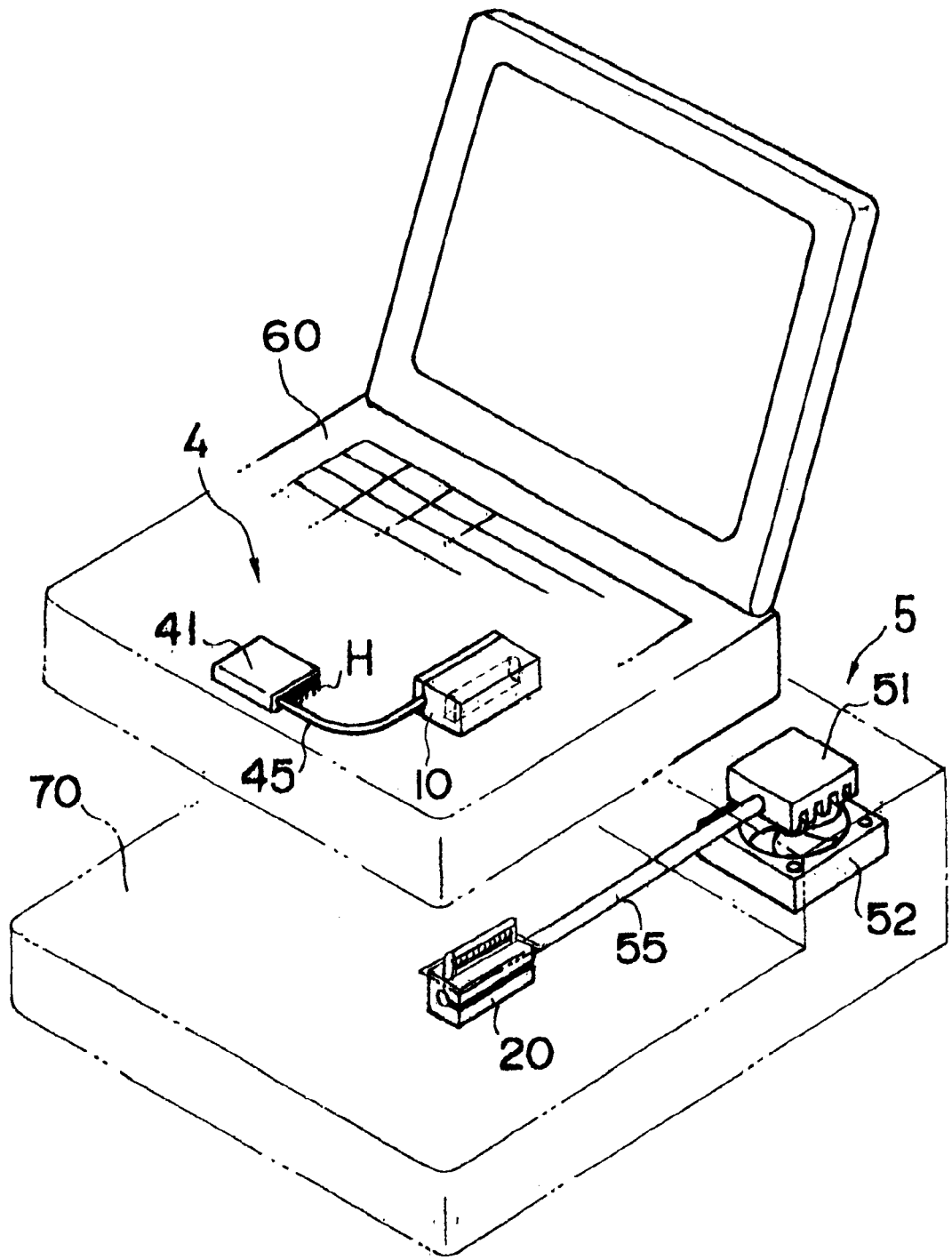
FIG. 6 is a perspective view of a notebook type personal computer which incorporates the heat-transport device including the heat-transfer connector.

FIG. 6 shows a so-called separable thin note PC, in which a heat-transport device comprising the heat-transfer connector 1 described above is incorporated. This note PC comprises a note PC main body 60 and a station 70, and the station 70 incorporates a FD drive, a CD drive, a power adapter, and a connector which is used for connecting outside peripheral equipment such as a printer. For this note PC to be used on a desk as a stationary unit, the main body 60 is mounted on the station 70. In this mounted condition, the main body 60 is connected electrically to the above mentioned drives and the connector in the station 70, and the note PC 60 can receive power through the adapter in the station 70, which is connected to a domestic electrical outlet. With this unlimited power supply, i.e., not limited by the amount of charge in the battery, the microprocessor of the note PC operates at a full capacity, and it can access to all the drives provided in the station. In this condition, the note PC with the station operates as a full capacity personal computer.

The note PC main body 60 is designed as an independently operable unit, so the main body 60 can be separated from the station 70 and taken outside. For such portability, the main body 60 is constructed in a relatively thin and light-weight unit and has a built-in battery as a power supply. To lengthen the operational time of the note PC in the separated condition, where the note PC is driven by the power supplied from the battery, the functions of the microprocessor are limited somewhat and the operational speed thereof is reduced to conserve the energy stored in the battery.

The above mentioned heat-collecting module 4 is incorporated in the note PC main body 60. Therefore, the heat collected from the microprocessor M, which is a heat-generating element in the main body, by the heat-collecting body 41, which is fixed in adhesion to the microprocessor, is transferred to the heat-collection side connector half 10 of the heat-transfer connector 1. The position of the heat-collection side connector half 10 in the main body 60 is determined appropriately in consideration of the positions of the hard disk unit, the built-in battery and other components and of the relation to the station 70. In this embodiment, an opening is provided at the bottom of the main body 60 for mounting the heat-collection side connector half 10 as shown in FIG. 6.

The above mentioned heat-radiation module 5 is incorporated in the station 70, such that the heat transferred to the heat-radiation side connector half 20, which is positioned (upward in FIG. 20 to meet the heat-collection side connector half 10, is transferred through the heat-radiation side heat pipe 55 to the heat-radiating fin 51, which is provided at the rear part of the station 70. There, the cooling fan 52 executes forced-air cooling.

When the note PC main body 60 is mounted onto the station 70, the heat-collection side connector half 10 and the heat-radiation side connector half 20 of the heat-transfer connector 1 are connected with each other by a single step in which the other terminals of the peripheral equipment and the power supply are also connected. When the microprocessor (MPU) operates at a full speed with all functions which are provided with the station 70, the heat generated from the MPU is transferred through the heat-transfer connector 1 to the heat-radiating fin 51 where a forced-air cooling is carried out by the cooling fan 52. Therefore, the cooling of the MPU is carried out effectively and efficiently. This prevents the MPU from experiencing a performance fall or an abnormal operation which may occur from overheat and also prevents the housing and the keyboard of the note PC from becoming too hot.

When the note PC main body 60 is detached from the station 70 for use as a portable unit, the heat-transfer connector 1 is disengaged, so that the heat-radiation module 5 is left with the station 70. When the note PC is operated in this condition, the MPU runs at a slower speed as described above and therefore produces less heat. Because the heat is produced in a lower rate in this operational condition, there is no need of any special cooler such as the heat-radiation module 5. The heat generated from the MPU is conducted to the housing or to the keyboard of the note PC 60 and then dissipated into the air naturally in an ordinary manner.

Thus, the heat-transport device which comprises the heat-transfer connector 1 according to the present invention functions to separate the heat-radiating means, which has been an obstacle against further miniaturization of thin note PCs in prior art, from the note PC main body and functions to attach it only when it is needed. Thus, the present invention opens a way for note PCs to be miniaturized even further.

For example, in a thermoelectric cooling device including an on-board cooler and a dehumidifier which comprises a Peltier element, the heat-radiating side (heated side) and the cooled side of the Peltier element are often required to be placed in different rooms. Therefore, the heated side and the cooled side may be separated by a partition wall. However, if the cooled side is positioned in the inner part of the system, then it is difficult to radiate the heat. In such a case, it is desired that heat-radiating means be provided additionally.

Such a prior-art problem can be solved by providing a heat transport type cooling device according to the present invention. In this case, a heat-collecting module is provided to the heated side of the Peltier element of the electronic cooler or the thermoelectric cooling device appropriately while a heat-radiating module is provide at a suitable position on the outer wall of the system. During the assembly of the system, these modules are mounted and connected to each other with a heat-transfer connector 1 according to the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

RELATED APPLICATIONS

This application claims the priority of Japanese Patent Application No. 11-268733 filed on Sep. 22, 1999 filed which is incorporated here in by reference.

What is claimed is:
1. A heat-transfer connector comprising:
   a first connector half having a first connector body made of a metal in which a receptive part with a concave cross-section is formed extending in a right and left direction; and
   a second connector half having a second connector body and a comb-like contact, said second connector body being made of a metal and including an insert part which extends in the right and left direction with a convex cross-section, and said comb-like contact made of a metal and capable of deforming elastically being provided along at least one of front and rear sides of said insert part and protruding outward from said front or rear side in a cross-sectional view;
   wherein:
      when said insert part is inserted in said receptive part, said first and second connector halves are detachably connected with each other for heat transfer through a solid contact achieved by abutment of said receptive part with said comb-like contact which is sandwiched between said insert part and said receptive part of said first and second connector halves and,
      wherein: said receptive part is formed in a rectangular box; and said insert part includes lateral end protection members at right and left ends thereof, said lateral end protection members being for protecting right and left ends of said comb-like contact when said insert part is inserted into said receptive part.
2. The heat-transfer connector set forth in claim 1 wherein said insert part includes a fixing part at a base end thereof, said fixing part being used for surface-mounting and fixing a root portion of said comb-like contact.
3. The heat-transfer connector set forth in claim 1 wherein said first and second connector bodies are formed of a metal having a high thermal conductivity such as an aluminum alloy and a copper alloy by a method of die-casting or shell-molding.
4. The heat-transfer connector set forth in claim 1 wherein: one of said first and second connector halves is connected through first heat-transferring means to heat-collecting means; and other of said first and second connector halves is connected through second heat-transferring means to heat-radiating means.
5. A heat-transfer connector comprising:
   a first connector half having a first connector body made of a metal in which a receptive part with a concave cross-section is formed extending in a right and left direction; and
   a second connector half having a second connector body and a comb-like contact, said second connector body being made of a metal and including an insert part which extends in the right and left direction with a convex cross-section, and said comb-like contact made of a metal and capable of deforming elastically being provided along at least one of front and rear sides of said insert part and protruding outward from said front or rear side in a cross-sectional view;
   wherein:
      when said insert part is inserted in said receptive part, said first and second connector halves are detachably connected with each other for heat transfer through a solid contact achieved by abutment of said receptive part with said comb-like contact which is sandwiched between said insert part and said receptive part of said first and second connector halves and,
      wherein said insert part includes an upper end protection member at an insertion edge thereof, said upper end protection member being for covering and protecting tooth tips of said comb-like contact.

6. A heat-transfer connector comprising:

a first connector half having a first connector body made of a metal in which a receptive part with a concave cross-section is formed extending in a right and left direction; and a second connector half having a second connector body and a comb-like contact, said second connector body being made of a metal and including an insert part which extends in the right and left direction with a convex cross-section, and said comb-like contact made of a metal and capable of deforming elastically being provided along at least one of front and rear sides of said insert part and protruding outward from said front or rear side in a cross-sectional view;

wherein:
when said insert part is inserted in said receptive part, said first and second connector halves are detachably connected with each other for heat transfer through a solid contact achieved by abutment of said receptive part with said comb-like contact which is sandwiched between said insert part and said receptive part of said first and second connector halves and, wherein:
said comb-like contact comprises a continuous plate-like root portion, contact portions and tooth tips, said contact portions being strips which are cut into a comb figure and each contact portion bending in an outward bulge; and said comb-like contact is fixed surface to surface on said insert part of said second connector half at an end of said root portion.

7. A heat-transfer connector comprising:

a first connector half having a first connector body made of a metal in which a receptive part with a concave cross-section is formed extending in a right and left direction; and a second connector half having a second connector body and a comb-like contact, said second connector body being made of a metal and including an insert part which extends in the right and left direction with a convex cross-section, and said comb-like contact made of a metal and capable of deforming elastically being provided along at least one of front and rear sides of said insert part and protruding outward from said front or rear side in a cross-sectional view;

wherein:
when said insert part is inserted in said receptive part, said first and second connector halves are detachably connected with each other for heat transfer through a solid contact achieved by abutment of said receptive part with said comb-like contact which is sandwiched between said insert part and said receptive part of said first and second connector halves and one of said first and second connector halves is connected through first heat-transferring means to heat-collecting means, and other of said first and second connector halves is connected through second heat-transferring means to heat-radiating means and, wherein said first and second heat-transferring means comprise heat pipes, respectively.

8. The heat-transfer connector set forth in claim 7 wherein said heat-collecting means comprises a heat-collecting body which is provided in contact with a microprocessor unit in a computer, said heat-collecting body collecting heat generated by said microprocessor unit.

9. The heat-transfer connector set forth in claim 7 wherein: a heat-collecting module including one of said first and second connector halves which is connected through said first heat-transferring means to said heat-collecting means is provided in a separable note PC main body; a heat-radiation module including the other of said first and second connector halves which is connected through said second heat-transferring means to said heat-radiating means is provided in a station unit, on which said separable note PC main body is mounted separably; and when said separable note PC is mounted on said station unit, said first and second connector halves are engaged and connected with each other for heat conduction.

10. A heat-transfer connector comprising:

a first connector half having a first connector body made of a metal in which a receptive part with a concave cross-section is formed extending in a right and left direction; and a second connector half having a second connector body and a comb-like contact, said second connector body being made of a metal and including an insert part which extends in the right and left direction with a convex cross-section, and said comb-like contact made of a metal and capable of deforming elastically being provided along at least one of front and rear sides of said insert part and protruding outward from said front or rear side in a cross-sectional view;

wherein:
when said insert part is inserted in said receptive part, said first and second connector halves are detachably connected with each other for heat transfer through a solid contact achieved by abutment of said receptive part with said comb-like contact which is sandwiched between said insert part and said receptive part of said first and second connector halves and one of said first and second connector halves is connected through first heat-transferring means to heat-collecting means and, wherein said heat-radiating means comprises a heat-radiating fin, which is connected to said second heat-transferring means, and a cooling fan, which drives a current of air to said heat-radiating fin.

* * * * *